US007183818B2

(12) United States Patent
Tsuji

(10) Patent No.: US 7,183,818 B2
(45) Date of Patent: Feb. 27, 2007

(54) TRIANGULAR WAVE GENERATING CIRCUIT ADAPTED TO CLASS-D AMPLIFIER

(75) Inventor: Nobuaki Tsuji, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 11/170,517

(22) Filed: Jun. 29, 2005

(65) Prior Publication Data
US 2006/0001461 A1    Jan. 5, 2006

(30) Foreign Application Priority Data
Jul. 2, 2004    (JP) .............................. 2004-197384

(51) Int. Cl.
*H03K 4/06*    (2006.01)
(52) U.S. Cl. ..................................... 327/132
(58) Field of Classification Search ................ 327/127, 327/130–132, 137; 330/251–252, 260, 271
See application file for complete search history.

(56) References Cited
U.S. PATENT DOCUMENTS
6,211,746 B1 *   4/2001  Segawa et al. ............. 331/143

6,265,921 B1 *   7/2001  Heinrich ...................... 327/170
6,791,405 B2     9/2004  Tsuji
6,956,431 B2 * 10/2005  Maejima ....................... 330/10

FOREIGN PATENT DOCUMENTS
JP           01-318424    12/1989
JP         2004-007324     1/2004

* cited by examiner

*Primary Examiner*—My-Trang Nu Ton
(74) *Attorney, Agent, or Firm*—Pillsbury Winthrop Shaw Pittman LLP

(57) ABSTRACT

A triangular wave generating circuit adapted to a class-D amplifier is designed not to use a PLL circuit and to secure robustness regarding an amplification gain irrespective of variations of voltages, thus producing a high-quality triangular wave with a simple circuit constitution. First and second constant currents, which are generated in proportion to positive and negative voltages, are alternately and periodically selected using high impedance elements without causing noise. A first integrator produces a triangular wave in response to charged electricity realized by the first and second constant currents, wherein the triangular wave is supplied to a second integrator performing servo-amplification operation so as to suppress phase shifts thereof. Hence, it is possible to maintain a constant gain for the class-D amplifier irrespective of variations of voltages since the maximal and minimal voltages values of the triangular wave are made proportional to the positive and negative voltages.

4 Claims, 5 Drawing Sheets

PRIOR ART

TRIANGULAR WAVE GENERATING CIRCUIT ADAPTED TO CLASS-D AMPLIFIER

BACKGROUND OF THE INVENTION

1. Field of the Invention

This invention generally relates to class-D amplifiers used for power amplification of audio signals, and in particular to triangular wave generating circuits, which are used for converting analog audio signals into pulse signals.

This application claims priority on Japanese Patent Application No. 2004-197384, the content of which is incorporated herein by reference.

2. Description of the Related Art

It is conventionally known that class-D amplifiers have simplified circuit configurations, which are simplified in the scale of the power source circuitry without using stabilized power sources. Japanese Patent Application Publication No. 2004-7324 (corresponding to U.S. Pat. No. 6,791,405 B2) teaches a technology in which triangular waves used for conversion of analog audio signals into pulse signals are controlled so as to cause variations with respect to wave heights of triangular waves following variations of voltages, thus suppressing variations of amplification gains.

FIG. 4 is a circuit diagram showing a conventionally known triangular wave generating circuit, wherein reference numeral 21 designates a terminal for inputting a reference clock pulse signal CK. Reference numeral 22 designates a digital phase comparator, which compares the phase of the clock pulse signal CK supplied to a reference input terminal IN and the phase of a signal NFB supplied to a comparison input terminal REF, so that it outputs a high-level signal (or a signal 'H') from an output terminal UP or an output terminal DW. Reference numeral 23 designates a loop filter that converts an output signal of the phase comparator 22 into an analog signal PLLC. Reference numeral 24 designates a circuit including capacitors 25 and 26 and a resistor 27, wherein the circuit 24 and the loop filter 23 are combined together to form a low-pass filter, so that the circuit 24 removes high frequency components from the output signal of the loop filter 23.

Reference numeral 30 designates an operational amplifier in which a non-inverting input terminal receives the output signal PLLC of the loop filter 23, an inverting input terminal is connected to a source of a field-effect transistor (FET) 32, and an output terminal is connected to a gate of the FET 32. The source of the FET 32 is grounded via a resistor 31, and a drain of the FET 32 is connected to a negative power source (whose voltage is set to −5V) via a load circuit 33. The load circuit 33 serves as a load for the FET 32 and is constituted by a single field-effect transistor. The operational amplifier 30, FET 32 and resistor 31 form a circuit that controls an electric current flowing through the load circuit 33 in response to the level of the output signal PLLC of the loop filter 23.

Reference numerals 34 and 35 designate constant current circuits each having a current value that is controlled by an electric current flowing through the load circuit 33, whereby they allow electric currents identical to the electric current flowing through the load circuit 33 to flow therethrough. Reference numerals 36 and 37 designate switches that are controlled to be turned on and off in response to the signal NFB. That is, when the signal NFB is at a low level ('L'), the switch 36 is turned on, but the switch 37 is turned off. When it is at a high level ('H'), the switch 36 is turned off, but the switch 37 is turned on. Reference numeral 39 designates an operational amplifier in which a non-inverting input terminal is grounded, an inverting input terminal is connected to a connection point between the switches 36 and 37, and an output terminal is connected to an output terminal 46. Reference numeral 40 designates a capacitor that is connected between the non-inverting input terminal and inverting input terminal of the operational amplifier 39. The operational amplifier 39 and the capacitor 40 are combined together to form an integration circuit.

Reference numeral 41 designates a comparator whose inverting input terminal receives the output signal of the operational amplifier 39. A voltage that is produced by dividing a voltage $V_{PX}$ by means of resistors 81 and 82 is applied to a non-inverting input terminal of the comparator 41. Reference numeral 42 designates a comparator in which an inverting input terminal receives the output signal of the operational amplifier 39, and a voltage that is produced by dividing a voltage $V_{MX}$ by means of resistors 83 and 84 is applied to a non-inverting input terminal. Herein, both of the resistors 81 and 83 have the same resistance, and both of the resistors 82 and 84 have the same resistance.

The output of the comparator 41 is applied to a first input of a NAND gate 44, and the output of the comparator 42 is applied to a first input of a NAND gate 45 via an inverter 43. The NAND gates 44 and 45 are combined together to form an RS flip-flop (or a reset/set flip-flop) whose output serves as the aforementioned signal NFB, which is delivered to the switches 36 and 37 as well as the phase comparator 22.

The aforementioned triangular wave generating circuit has a phase-locked loop (PLL) configuration. The non-inverting input terminal of the comparator 41 receives voltage V1, which is expressed as follows:

$$V_1 = \frac{V_{PX}}{a}$$

The non-inverting input terminal of the comparator 42 receives voltage $V_2$, which is expressed as follows:

$$V_2 = \frac{V_{MX}}{a}$$

In the above, reference symbols $V_{PX}$ and $V_{MX}$ designate the aforementioned voltages; and reference symbol 'a' designates a positive constant, which is expressed as follows:

$$a = \frac{R_{82}}{R_{81} + R_{82}} = \frac{R_{84}}{R_{83} + R_{84}}$$

Reference symbols $R_{81}$, $R_{82}$, $R_{83}$, and $R_{84}$ designate resistances of the aforementioned resistors 81, 82, 83, and 84 respectively.

In accordance with the aforementioned equations, a triangular wave output from the output terminal 46 has a maximal value $V_P$ and a minimal value $V_M$, which correspond to the aforementioned voltages $V_1$ and $V_2$ respectively, so that a gain G is expressed as follows:

$$G = \frac{V_{PX} - V_{MX}}{V_P - V_M} = \frac{V_{PX} - V_{MX}}{\frac{V_{PX}}{a} - \frac{V_{MX}}{a}} = a$$

Other types of triangular wave generating circuits not using PLL circuits have been conventionally developed, an example of which is disclosed in Japanese Patent Application Publication No. H01-318424. In this triangular wave generating circuit, rectangular waves having voltages +V and −V are alternately generated and are then subjected to integration using an integration circuit, thus producing a triangular wave. A closed-loop is constituted by directly connecting an integrator and an inverting amplifier between the output terminal and input terminal of the integration circuit. That is, the integration circuit integrates a triangular wave to generate an offset voltage, which is then negatively fed back to the input terminal of the integration circuit via the inverting amplifier, thus producing a triangular wave whose waveform is symmetrical with respect to the positive side and negative side.

The triangular wave generating circuit disclosed in Japanese Patent Application Publication No. 2004-7324 uses a PLL circuit, wherein it may be necessary for an engineer to design the circuitry to have a stable phase fixing ability. Improving the stability regarding the phase fixing operation may increase the circuit scale of the aforementioned loop filter. In addition, this may cause numerous jitters so that the output waveform of the class-D amplifier may have unwanted distortion.

The triangular wave generating circuit disclosed in Japanese Patent Application Publication No. H01-318424 does not use a PLL circuit, and therein it is possible to simplify the circuit configuration; however, due to the provision of a closed-loop, an engineer may experience difficulty in realizing stable operation. In addition, this circuit cannot follow up with variations of the voltages $V_{PX}$ and $V_{MX}$; hence, when it is applied to a class-D amplifier not using a stabilized power source, there is a problem that the gain may become unstable.

SUMMARY OF THE INVENTION

It is an object of the present invention to provide a triangular wave generating circuit adapted to a class-D amplifier that is in particular used for power amplification of audio signals, wherein the circuit configuration thereof can be simplified by eliminating a PLL circuit therefor so as to secure robustness of an amplification gain in respect of variations of a voltage thereof.

A triangular wave generating circuit adapted to a class-D amplifier, in which an input signal is subjected to pulse-width modulation and is then subjected to switched amplification, is designed to include a first constant current generating circuit for generating a first constant current in proportion to a positive voltage applied thereto; a second constant current generating circuit for generating a second constant current in proportion to a negative voltage applied thereto; a current selecting circuit, which includes a plurality of high impedance elements (e.g., FETs), for alternately and periodically selecting the first constant current and the second constant current; a first integrator in which an amplifier is coupled with a capacitor, wherein the first integrator produces a triangular wave in response to charged electricity that is stored in the capacitor in response to the first constant current or the second constant current, which is selectively applied thereto; and a second integrator for integrating the triangular wave output from the first integrator so as to produce a phase correction instruction, which is negatively fed back to the first integrator.

In the above, the first and second constant currents are produced based on the positive and negative voltages applied to the switched amplification and are subjected to integration so as to produce a triangular wave, whereby it is possible to maintain the gain of the class-D amplifier constant irrespective of variations of voltages. The first and second constant currents are alternately selected using high impedance elements, which do not cause noise when they are alternately selected; hence, it is possible to produce an appropriate waveshape of a triangular wave. It is possible to suppress phase shifts of a triangular wave in response to the phase correction instruction output from the second integrator irrespective of phase shifts included in the first and second constant currents when they are alternately selected. In addition, the triangular wave generating circuit of this invention does not require a PLL circuit that causes jitters. This demonstrates a simplification of the circuitry, and it is possible to avoid occurrence of jitters.

The triangular wave generating circuit may further include an offset instructor for producing an offset instruction by superposing current components of the first constant current and the second constant current, wherein the offset instruction is applied to the first integrator.

In the above, it is possible to adjust the offset of a triangular wave in response to unbalance occurring in the positive and negative voltages; hence, it is possible to reliably maintain the gain of the class-D amplifier constant.

In addition, the offset instructor may include a third constant current generating circuit for generating a third constant current in proportion to the first constant current and a fourth constant current generating circuit for generating a fourth constant current in proportion to the second constant current, wherein the third constant current generating circuit and the fourth constant current generating circuit are connected in series at a point, which is connected to an input terminal of the second integrator.

In the above, the offset instructor can be realized by simply connecting in series the third and fourth constant current generating circuits at a connection point, which is connected to the input terminal of the second integrator.

Furthermore, the first constant current generating circuit may include a first resistance circuit for producing the first constant current based on the positive voltage and a first current mirror circuit allowing the first constant current to flow therethrough in a prescribed direction, so that the first constant current is selected by means of a first field-effect transistor which is included in the first current mirror circuit and whose gate receives a clock pulse signal; and the second constant current generating circuit may include a second resistance circuit for producing the second constant current based on negative voltage and a second current mirror circuit allowing the second constant current to flow therethrough in a prescribed direction, so that the second constant current is selected by means of a second field-effect transistor which is included in the second current mirror circuit and whose gate receives a clock pulse signal. This contributes to simplification of the circuitry.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENTS

This invention will be described in further detail by way of examples with reference to the accompanying drawings.

Figure 1:
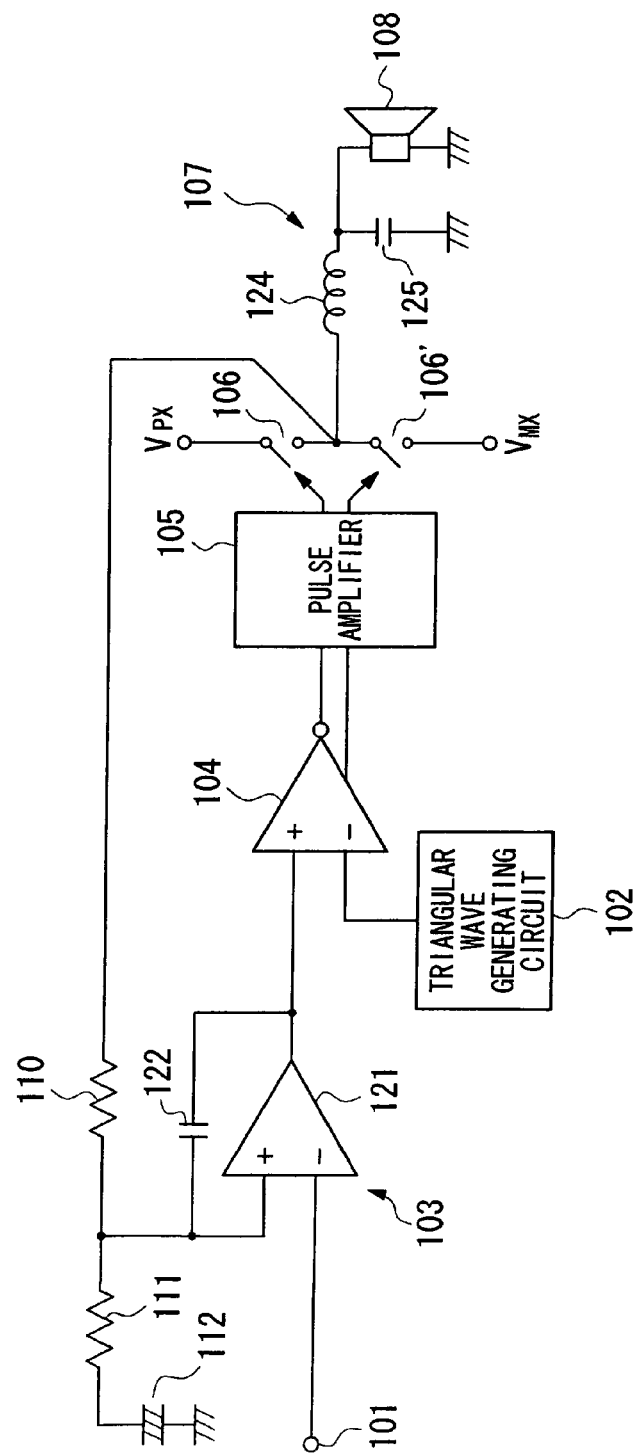
FIG. 1 is a block diagram showing the overall constitution of a class-D amplifier using a triangular wave generating circuit in accordance with a preferred embodiment of the invention.

FIG. 1 is a block diagram showing the overall constitution of a class-D amplifier using a triangular wave generating circuit in accordance with a preferred embodiment of the invention.

Reference numeral 101 designates an analog signal input terminal; reference numeral 102 designates a triangular wave generating circuit; and reference numeral 103 designates an integrator. The integrator 103 is constituted by an operational amplifier 121, and a capacitor 122, which is connected between a non-inverting input terminal and an output terminal of the operational amplifier 121.

Reference numeral 104 designates a voltage comparator that compares the output of the integrator 103 with the output of the triangular wave generating circuit 102; reference numeral 105 designates a pulse amplifier; and reference numerals 106a and 106b designate switches that are controlled to be turned on and off in response to the output of the pulse amplifier 105. Reference symbol $V_{PX}$ designates a positive power source, and reference symbol $V_{MX}$ designates a negative power source. Reference numeral 110 designates a feedback resistor that feeds back a pulse-width modulated signal (or a PWM signal), which emerges at a connection point Q between the switches 106a and 106b, to the integrator 103, wherein a feedback value depends on the resistance of the resistor 110 and the resistance of a resistor 111. Reference numeral 112 designates a capacitor used for cutting off dc components. Reference numeral 107 designates a low-pass filter (LPF) that is constituted by a coil 124 and a capacitor 125. Reference numeral 108 designates a load.

In FIG. 1, an analog input signal is supplied to the voltage comparator 104 via the integrator 103, where it is compared with an output S1 of the triangular wave generating circuit 102, so that the voltage comparator 104 produces pulse signals subjected to pulse width modulation (PWM). The pulse signals are amplified by the pulse amplifier 105 and are then subjected to switched amplification by the switches 106a and 106b. The LPF 107 converts resultant signals (which have already been subjected to switched amplification) into analog signals, which are then applied to the load 108.

Figure 2:
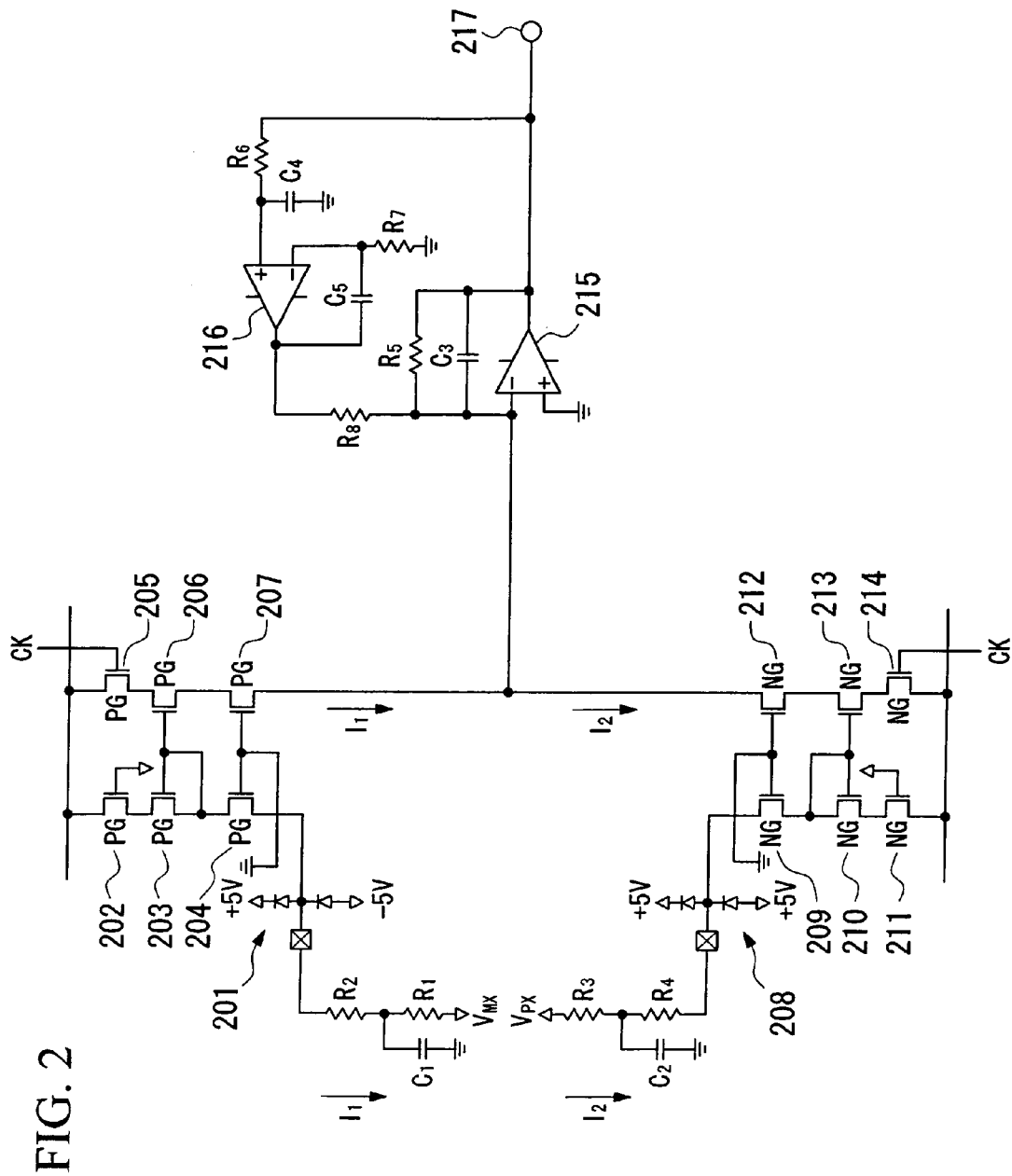
FIG. 2 is a circuit diagram showing a triangular wave generating circuit in accordance with a first embodiment of the invention.

FIG. 2 is a circuit diagram showing the details of a triangular wave generating circuit in accordance with a first embodiment of the invention. Reference symbols NG designate n-channel gates each configured by an FET, and reference symbols PG designate p-channel gates each configured by an FET. Resistors $R_1$ and $R_2$ are connected in series; and a capacitor $C_1$ is connected between the ground and a connection point between the resistors $R_1$ and $R_2$. These circuit components function to produce a constant current $I_1$ in proportion to the actual value of the negative voltage $V_{MX}$. Reference numeral 201 designates an input terminal for the constant current $I_1$, which absorbs excess current when the constant current $I_1$ becomes excessive.

Reference numerals 202 to 207 designate field-effect transistors (FETs), wherein the FETs 202 to 204 are connected in series, and the FETs 205 to 207 are connected in series. Negative voltage is applied to the gate of the FET 202, and a clock pulse signal is applied to the gate of the FET 205. The source of the FET 203 is connected with the gates of the FET 203 and the gate of the FET 206. Both of the gate of the FET 204 and the gate of the FET 207 are grounded. The source of the FET 204 is connected with the input terminal 201. Thus, a series circuit in which the FETs 202 to 204 are connected in series and a series circuit in which the FETs 205 to 207 are connected in series are combined together to form a current mirror circuit; hence, currents both identical to the current $I_1$ are forced to flow through the series circuits respectively.

Similarly, resistors $R_3$ and $R_4$ are connected in series, and a capacitor $C_2$ is connected between the ground and a connection point between the resistors $R_3$ and $R_4$, whereby it is possible to produce a constant current $I_2$ in proportion to the positive voltage $V_{PX}$. Reference numeral 208 designates an input terminal for the constant current $I_2$, which absorbs excess current when the constant current $I_2$ becomes excessive.

Reference numerals 209 to 214 designate FETs, wherein the FETs 209 to 211 are connected in series, and the FETs 212 to 214 are connected in series. As described above, a series circuit constituted by the FETs 209–211 and a series circuit constituted by the FETs 212–214 are combined together to form a current mirror circuit, wherein currents both identical to the current $I_2$ are forced to flow through the series circuits respectively.

Reference numeral 215 designates an operational amplifier in which the currents $I_1$ and $I_2$ are applied to an inverting input terminal, while a non-inverting input terminal is grounded. A capacitor $C_3$ and a resistor $R_5$ are connected in parallel between the inverting input terminal and output terminal of the operational amplifier 215, thus forming an integrator. The output terminal of the operational amplifier 215 is connected to a triangular wave output terminal 217.

Reference numeral 216 designates an operational amplifier in which a non-inverting input terminal is connected with the output terminal of the operational amplifier 215 via a resistor $R_6$. A capacitor $C_4$ is connected between the ground and the non-inverting input terminal of the operational amplifier 216; a capacitor $C_5$ is connected between an inverting input terminal and an output terminal of the operational amplifier 216; and a resistor $R_7$ is connected between the ground and the inverting input terminal of the operational amplifier 216. A resistor $R_8$ is connected between the output terminal of the operational amplifier 216 and the inverting input terminal of the operational amplifier 215. The aforementioned circuit components are combined together to form a closed-loop servosystem realizing negative feedback of the output of the operational amplifier 215.

Next, the overall operation of the triangular wave generating circuit according to the first embodiment will be described. Both of the FETs 205 and 214 receive a clock pulse signal CK given from an external device (not shown), wherein in a low-level period of the clock pulse signal CK, the constant current $I_1$ flows through the series circuit consisting of the FETs 205 to 207, while in a high-level period of the clock pulse signal CK, the constant current $I_2$ flows through the series circuit consisting of the FETs 212 to 214. Both of the series circuits are constituted using FETs having high impedance; hence, there is no possibility that noise occurs when the aforementioned currents are switched over.

The capacitor $C_3$ is charged by the constant current $I_1$ flowing through the series circuit consisting of the FETs 205 to 207 and the constant current $I_2$ flowing through the series circuit consisting of the FETs 212 to 214, whereby the operational amplifier 215 combined with the capacitor $C_3$ performs integration so as to generate a triangular wave. There is a possibility that phase shifts may occur with respect to timings for applying the constant currents $I_1$ and $I_2$ due to deviations of a duty ratio of the clock pulse signal CK, whereas the operation amplifier 216 performs a servo-amplification operation to suppress such phase shifts. That is, the operational amplifier 216 compares an input signal applied to the non-inverting input terminal thereof with a signal negatively fed back to the inverting input terminal thereof so as to produce a comparison result, which is then negatively fed back to the operational amplifier 215 as a phase correction instruction, by which a triangular wave to be generated is corrected in phase; as a result, it is possible to suppress phase shifts of the triangular wave due to phase shifts of the applying timings of the constant currents $I_1$ and $I_2$.

The rising slope of a triangular wave can be adjusted by appropriately adjusting the resistances of the resistors $R_6$ and $R_7$ and the capacitances of the capacitors $C_4$ and $C_5$. The degree of roundness of the top portion of a triangular wave can be adjusted appropriately adjusting the resistance of the resistor $R_8$. When the top portion of a triangular wave does not need to be rounded in waveshape, it is possible to omit the resistor $R_8$. The rising slope of the triangular wave can be adjusted by appropriately adjusting the resistance of the resistor $R_5$ and the capacitance of the capacitor $C_3$.

Thus, it is possible to produce a triangular wave, in which the maximal voltage value and minimal voltage value have proportional relationships with the voltages $V_{PX}$ and $V_{MX}$; hence, it is possible to maintain the gain G of the class-D amplifier irrespective of variations of the voltages $V_{PX}$ and $V_{MX}$.

Figure 3:
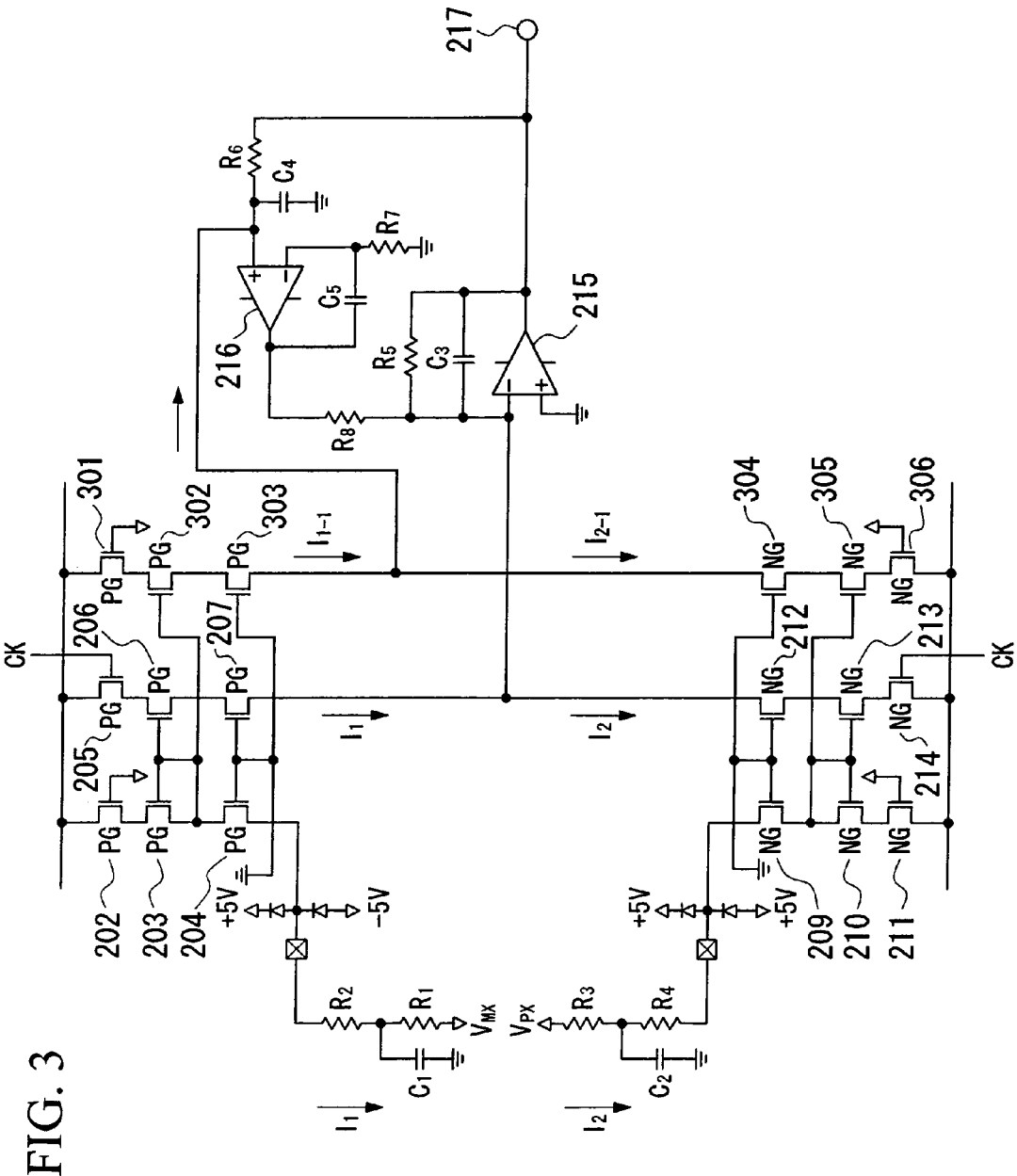
FIG. 3 is a circuit diagram showing a triangular wave generating circuit in accordance with a second embodiment of the invention.
Figure 4:
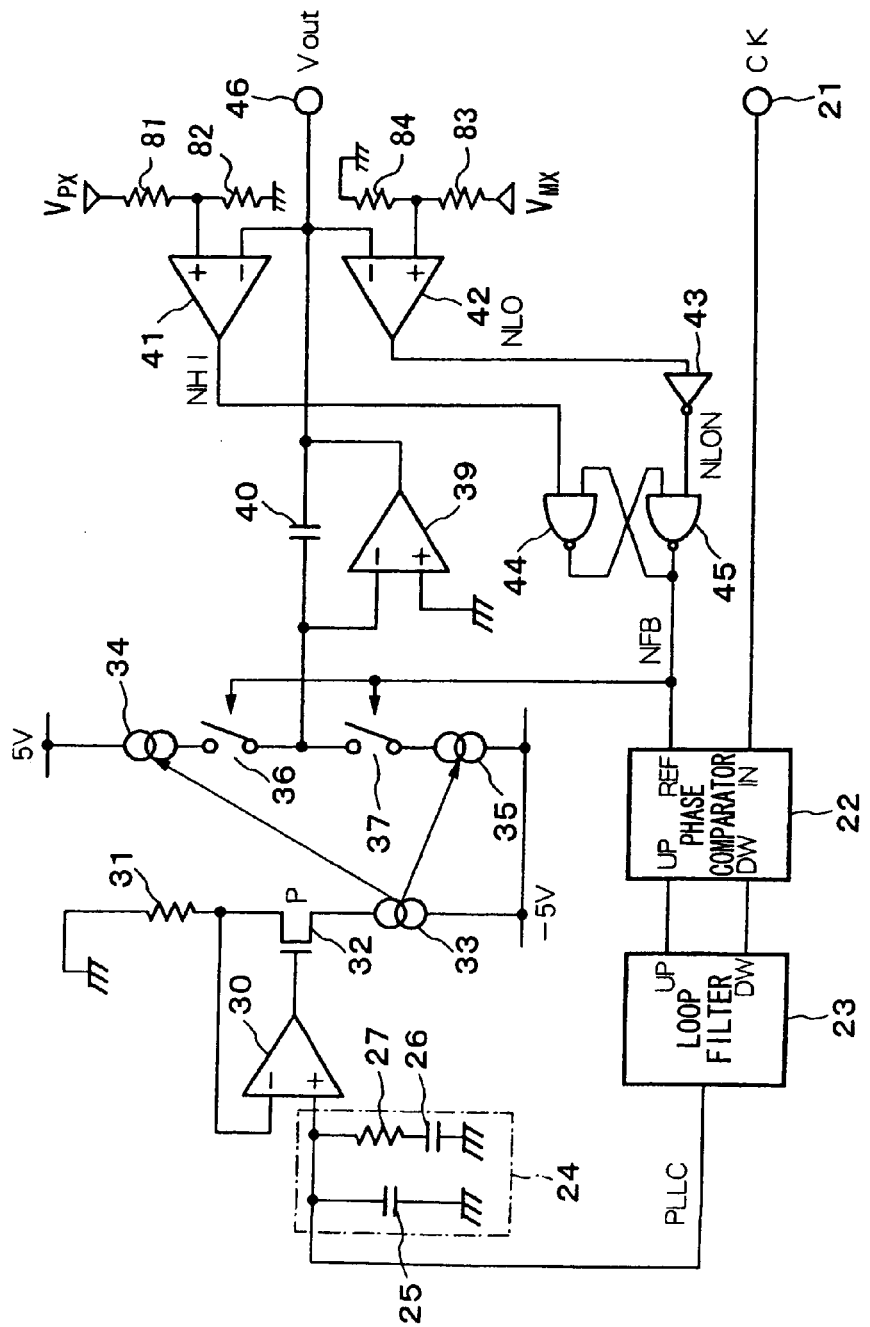
FIG. 4 is a circuit diagram showing a conventionally known triangular wave generating circuit.

FIG. 3 is a circuit diagram showing the configuration of a triangular wave generating circuit in accordance with a second embodiment of the invention, wherein parts identical to those shown in FIG. 2 are designated by the same reference numerals; hence, the detailed description thereof will be omitted. In FIG. 3, reference numerals 301 to 303 designate FETs that are connected in series. Negative voltage is applied to the gate of the FET 301; the gate of the FET 302 is connected with the source of the FET 203; and the gate of the FET 303 is connected with the gate of the FET 204. The source of the FET 203 is connected with the gate of the FET 203 and the gate of the FET 206. Hence, a constant current $I_{1-1}$ that is proportional to the constant current $I_1$ flowing through the series circuit consisting of the FETs 205 to 207 is forced to flow through a series circuit consisting of the FETs 301 to 303.

Similarly, FETs 304 to 306 are connected in series, so that a constant current $I_{2-1}$ that is proportional to the constant current $I_2$ flowing through the series circuit consisting of the FETs 212 to 214 is forced to flow through a series circuit consisting of the FETs 304 to 306.

Both of the series circuit of the FETs 301–303 and the series circuit of the FETs 304–306 are connected in series, wherein the connection point therebetween is connected with the non-inverting input terminal of the operational amplifier 216.

Next, the overall operation of the triangular wave generating circuit of FIG. 3 will be described. The drain potential (or gate potential) of the FET 203 depends on the voltage $V_{MX}$ by means of the FET 204, based on which the current $I_{1-1}$ flowing through the FETs 302 and 303 is determined; hence, the current $I_{1-1}$ is varied in response to variations of the voltage $V_{MX}$. Similarly, the current $I_{2-1}$ depends on the voltage $V_{PX}$, wherein the current $I_{2-1}$ is varied in response to variations of the voltage $V_{PX}$.

When the absolute values of the voltages $V_{PX}$ and $V_{MX}$ are identical to each other, the constant currents $I_{1-1}$ and $I_{2-1}$ become identical to each other so that no current component flows into the operational amplifier 216; hence, similarly in the aforementioned triangular wave generating circuit shown in FIG. 2, this triangular wave generating circuit generates a triangular wave.

When the voltages $V_{PX}$ and $V_{MX}$ becomes unbalanced so that differences of absolute values thereof occur therebetween, such differences must be reflected on the currents $I_{1-1}$ and $I_{2-1}$ and are applied to the non-inverting input terminal of the operational amplifier 216, whereby it is possible to correct the offset with respect to a triangular wave; hence, the maximal value and minimal value of a triangular wave can be varied to precisely follow up with the voltages $V_{PX}$ and $V_{MX}$.

Figure 5:
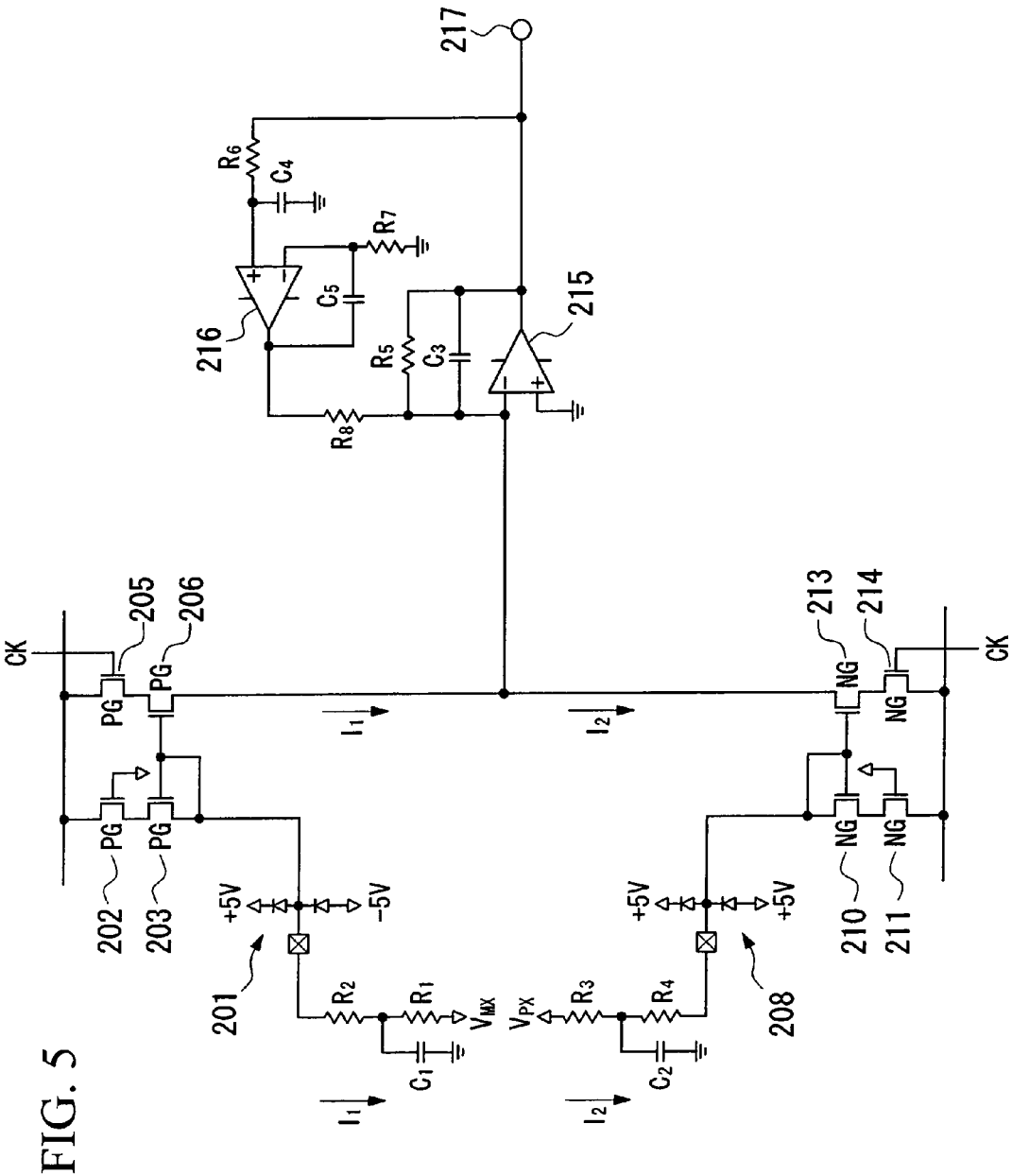
FIG. 5 is a circuit diagram showing a triangular wave generating circuit in accordance with a third embodiment of the invention.

FIG. 5 is a circuit diagram showing a triangular wave generating circuit in accordance with a third embodiment of the invention. The triangular wave generating circuit of FIG. 5 is designed by removing the FETs 204, 207, 209, and 212 from the aforementioned triangular wave generating circuit of FIG. 2. That is, the triangular wave generating circuit of FIG. 5 basically operates similarly to the aforementioned triangular wave generating circuit of FIG. 2 so as to demonstrate prescribed effects similar to those of the first embodiment; hence, the detailed description thereof will be omitted. In addition, it is possible to modify the third embodiment such that the FETs 202 and 211 are removed from the triangular wave generating circuit of FIG. 5, wherein the modified circuitry performs an overall operation similar to that of the first embodiment; hence, it can demonstrate prescribed effects similar to those of the first embodiment.

Furthermore, it is possible to modify the second embodiment such that the FETs 202, 204, 207, 209, 211, 212, 301, 303, 304, and 306 are removed from the triangular wave generating circuit of FIG. 3, wherein the modified circuitry performs an overall operation similar to that of the second embodiment; hence, it can demonstrate prescribed effects similar to those of the second embodiment.

As this invention may be embodied in several forms without departing from the spirit or essential characteristics thereof, the present embodiments are therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

What is claimed is:

1. A triangular wave generating circuit adapted to a class-D amplifier in which an input signal is subjected to pulse-width modulation and is then subjected to switched amplification, said triangular wave generating circuit comprising:
   a first constant current generating circuit for generating a first constant current in proportion to a positive voltage applied thereto;
   a second constant current generating circuit for generating a second constant current in proportion to a negative voltage applied thereto;
   a current selecting circuit, which includes a plurality of high impedance elements, for alternately and periodically selecting the first constant current and the second constant current;
   a first integrator in which an amplifier is coupled with a capacitor, wherein the first integrator produces a triangular wave in response to charged electricity that is stored in the capacitor in response to the first constant current or the second constant current, which is selectively applied thereto; and
   a second integrator for integrating the triangular wave output from the first integrator so as to produce a phase correction instruction, which is negatively fed back to the first integrator.

2. A triangular wave generating circuit according to claim 1 further comprising an offset instructor for producing an offset instruction by superposing current components of the first constant current and the second constant current, wherein the offset instruction is applied to the first integrator.

3. A triangular wave generating circuit according to claim 2, wherein the offset instructor includes a third constant current generating circuit for generating a third constant current in proportion to the first constant current and a fourth constant current generating circuit for generating a fourth constant current in proportion to the second constant current, and wherein the third constant current generating circuit and the fourth constant current generating circuit are connected in series at a point, which is connected to an input terminal of the second integrator.

4. A triangular wave generating circuit according to claim 1, wherein the first constant current generating circuit includes a first resistance circuit for producing the first constant current based on the positive voltage and a first current mirror circuit allowing the first constant current to flow therethrough in a prescribed direction, so that the first constant current is selected by means of a first field-effect transistor which is included in the first current mirror circuit and whose gate receives a clock pulse signal, and wherein the second constant current generating circuit includes a second resistance circuit for producing the second constant current based on the negative voltage and a second current mirror circuit allowing the second constant current to flow therethrough in the prescribed direction, so that the second constant current is selected by means of a second field-effect transistor which is included in the second current mirror circuit and whose gate receives the clock pulse signal.

* * * * *